(12) United States Patent
Kikuchi et al.

(10) Patent No.: US 11,961,906 B2
(45) Date of Patent: Apr. 16, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takuo Kikuchi, Kamakura (JP); Kazuyuki Ito, Kamakura (JP); Satoshi Akutsu, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 310 days.

(21) Appl. No.: 17/643,982

(22) Filed: Dec. 13, 2021

(65) Prior Publication Data

US 2022/0302304 A1    Sep. 22, 2022

(30) Foreign Application Priority Data

Mar. 16, 2021 (JP) ................................ 2021-042050

(51) Int. Cl.
*H01L 29/78* (2006.01)
*H01L 29/06* (2006.01)
*H01L 29/40* (2006.01)

(52) U.S. Cl.
CPC ...... *H01L 29/7813* (2013.01); *H01L 29/0696* (2013.01); *H01L 29/405* (2013.01); *H01L 29/407* (2013.01)

(58) Field of Classification Search
CPC ............ H01L 29/7813; H01L 29/0696; H01L 29/405; H01L 29/407
(Continued)

(56) References Cited

U.S. PATENT DOCUMENTS

2017/0263768 A1* 9/2017 Katoh ............... H01L 29/66666
2019/0252543 A1   8/2019 Fukunaga et al.
(Continued)

FOREIGN PATENT DOCUMENTS

JP    2019-165182 A    9/2019
JP    2020-47742 A     3/2020
WO   WO 2018/078776 A1  5/2018

*Primary Examiner* — Igwe U Anya
(74) *Attorney, Agent, or Firm* — Oblon, McClelland, Maier & Neustadt, L.L.P.

(57) ABSTRACT

A semiconductor device according to an embodiment includes first to third semiconductor regions, a structure body, a gate electrode, and a high resistance part. The structure body includes an insulating part and a conductive part. The insulating part is arranged with the third semiconductor region, the second semiconductor region, and a portion of the first semiconductor region. The conductive part is located in the insulating part. The conductive part includes a portion facing the first semiconductor region. The high resistance part is located in the first semiconductor region and has a higher electrical resistance than the first semiconductor region. A plurality of the structure bodies includes first to third structure bodies. The second and third structure bodies are next to the first structure body. The high resistance part overlaps a circle center of an imaginary circle passing through centers of the first to third structure bodies.

9 Claims, 4 Drawing Sheets

(58) Field of Classification Search
USPC .......................................................... 257/330
See application file for complete search history.

(56) References Cited

U.S. PATENT DOCUMENTS

| | | |
|---|---|---|
| 2019/0296116 A1 | 9/2019 | Matsuba et al. |
| 2020/0091338 A1 | 3/2020 | Nishiwaki |
| 2021/0057574 A1* | 2/2021 | Nishiwaki ........... H01L 29/0696 |
| 2021/0091188 A1* | 3/2021 | Ito ..................... H01L 29/66734 |
| 2021/0288178 A1* | 9/2021 | Kikuchi ............ H01L 29/41766 |

* cited by examiner

United States Patent US 11,961,906 B2

SEMICONDUCTOR DEVICE

CROSS-REFERENCE TO RELATED APPLICATIONS

This application is based upon and claims the benefit of priority from Japanese Patent Application No. 2021-042050, filed on Mar. 16, 2021; the entire contents of which are incorporated herein by reference.

FIELD

Embodiments described herein relate generally to a semiconductor device.

BACKGROUND

A semiconductor device such as a vertical metal oxide semiconductor field effect transistor (MOSFET) or the like is used in applications such as power conversion, etc. It is desirable to increase the breakdown voltage of the semiconductor device.

DETAILED DESCRIPTION

A semiconductor device according to an embodiment includes a first semiconductor region of a first conductivity type, a second semiconductor region of a second conductivity type, a third semiconductor region of the first conductivity type, a structure body, a gate electrode, and a high resistance part. The second semiconductor region is located on the first semiconductor region. The third semiconductor region is located selectively on the second semiconductor region. The structure body includes an insulating part and a conductive part. The insulating part is arranged with the third semiconductor region, the second semiconductor region, and a portion of the first semiconductor region in a second direction and a third direction, wherein the second direction is perpendicular to a first direction that is from the first semiconductor region toward the second semiconductor region; and the third direction crosses the second direction and is perpendicular to the first direction. The conductive part is located in the insulating part and includes a portion facing the first semiconductor region in the second and third directions. The gate electrode faces the second semiconductor region in the second and third directions. The high resistance part is located in the first semiconductor region and has a higher electrical resistance than the first semiconductor region. A plurality of structure bodies is arranged along the second and third directions. The plurality of the structure bodies includes a first structure body, a second structure body, and a third structure body. The second structure body is next to the first structure body in the second direction. The third structure body is next to the first structure body in the third direction. The high resistance part overlaps a circle center of an imaginary circle in the first direction, wherein the imaginary circle passes through centers in the second and third directions of each of the first, second, and third structure bodies.

Exemplary embodiments will now be described with reference to the drawings.

The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

In the specification of the application and the drawings, components similar to those described in regard to a drawing thereinabove are marked with like reference numerals; and a detailed description is omitted as appropriate.

In the following description and drawings, the notations of n+, n−, p+, and p indicate relative levels of the impurity concentrations. Namely, a notation marked with "+" indicates that the impurity concentration is relatively greater than that of a notation not marked with either "+" or "−"; and a notation marked with "−" indicates that the impurity concentration is relatively less than a notation without any mark. When both an impurity that forms acceptors and an impurity that forms donors are included in each region, these notations indicate relative levels of the net impurity concentrations after the impurities are compensated.

In the embodiments described below, each embodiment may be implemented by inverting the p-type and the n-type of the semiconductor regions.

First Embodiment

Figure 1:
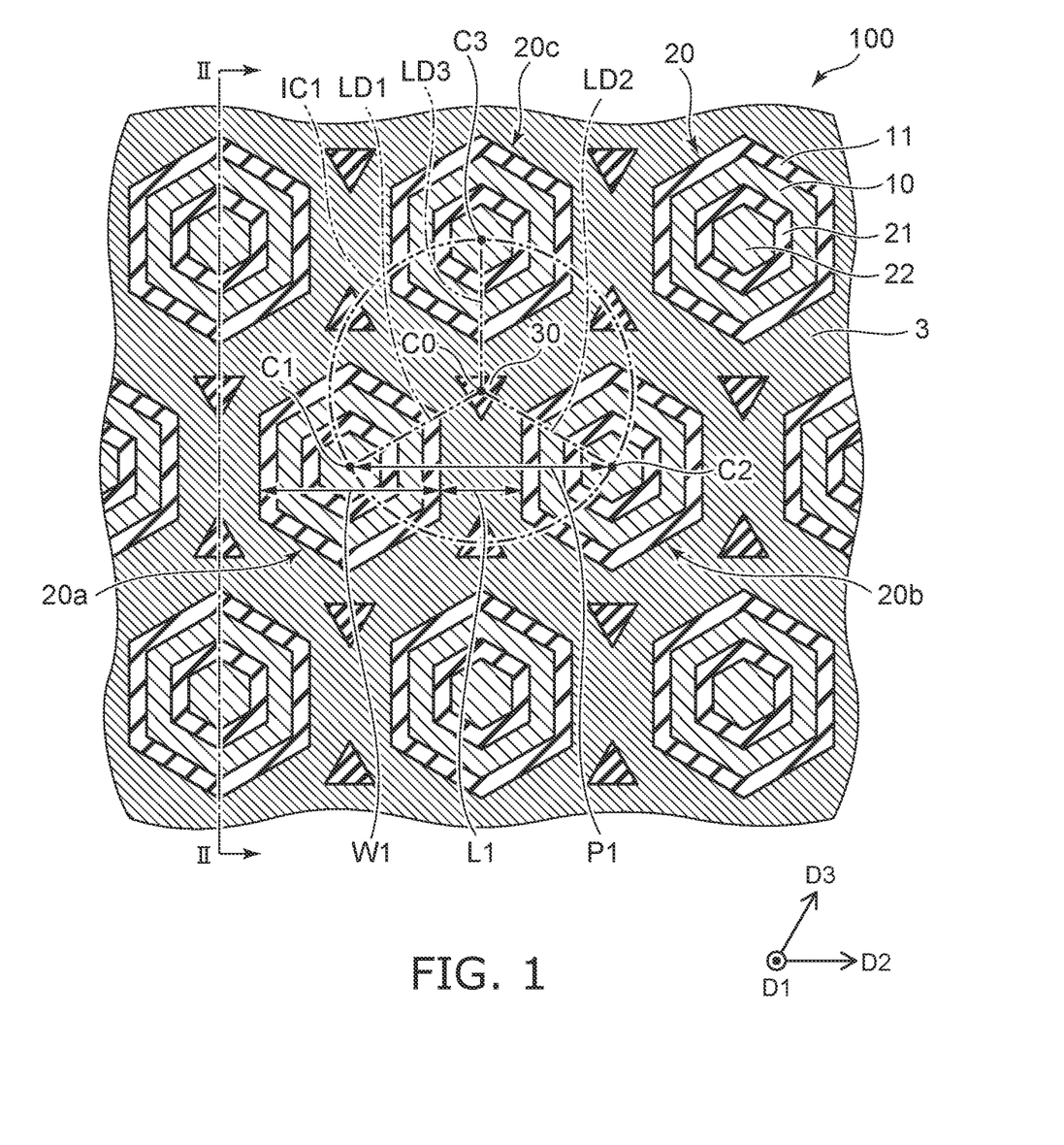
FIG. 1 is a plan view illustrating a portion of a semiconductor device according to a first embodiment.

FIG. 1 is a plan view illustrating a portion of a semiconductor device according to a first embodiment.

Figure 2:
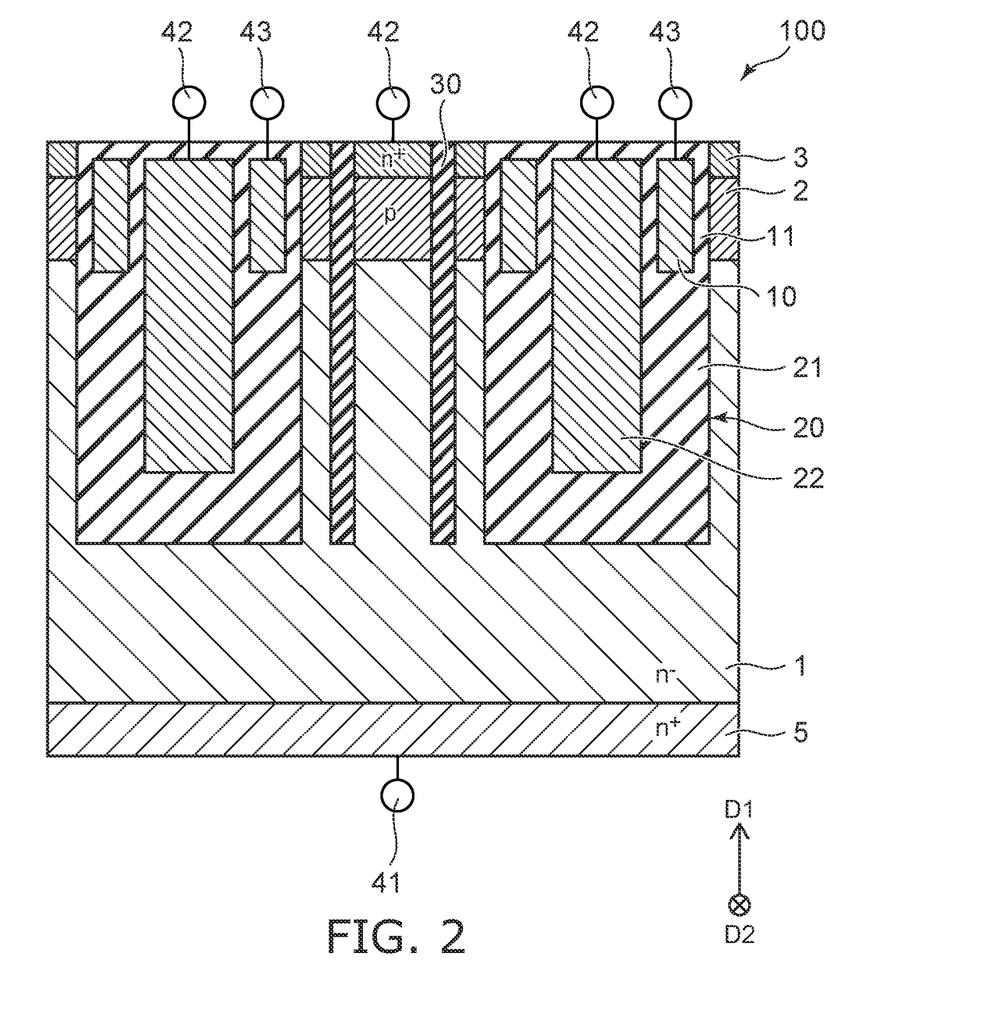
FIG. 2 is a II-II cross-sectional view of FIG. 1.

FIG. 2 is a II-II cross-sectional view of FIG. 1.

The semiconductor device 100 according to the first embodiment is, for example, a vertical MOSFET. The semiconductor device 100 is a MOSFET that has a so-called dot structure.

As illustrated in FIGS. 1 and 2, the semiconductor device 100 includes an n−-type (first-conductivity-type) drift region 1 (a first semiconductor region), a p-type (second-conductivity-type) base region 2 (a second semiconductor region), an n+-type source region 3 (a third semiconductor region), an n+-type drain region 5, a gate electrode 10, a structure body 20, and a high resistance part 30.

A first direction D1, a second direction D2, and a third direction D3 are used in the description of the following embodiments. The direction from the n−-type drift region 1 toward the p-type base region 2 is taken as the first direction D1. One direction perpendicular to the first direction D1 is taken as the second direction D2. A direction that crosses the second direction D2 and is perpendicular to the first direction D1 is taken as the third direction D3. In the description, the direction from the n−-type drift region 1 toward the p-type base region 2 is called "up", and the opposite direction is called "down". These directions are based on the relative positional relationship between the n−-type drift region 1 and the p-type base region 2 and are independent of the direction of gravity.

As illustrated in FIGS. 1 and 2, the n+-type drain region 5 is located at the lower portion of the semiconductor device 100. The n−-type drift region 1 is located on the n+-type drain region 5. The p-type base region 2 is located on the n−-type drift region 1. The n+-type source region 3 is selectively located on the p-type base region 2.

The structure body 20 includes an insulating part 21 and a conductive part 22. The insulating part 21 is arranged with the n$^+$-type source region 3, the p-type base region 2, and a portion of the n$^-$-type drift region 1 in the second and third directions D2 and D3. The conductive part 22 is located in the insulating part 21. At least a portion of the conductive part 22 is arranged with a portion of the n$^-$-type drift region 1 in the second and third directions D2 and D3. Also, a portion of the conductive part 22 may be arranged with the p-type base region 2 and the n$^+$-type source region 3 in the second and third directions D2 and D3.

In the semiconductor device 100, the gate electrode 10 also is located in the insulating part 21. The gate electrode 10 is located around the upper portion of the conductive part 22 in the second and third directions D2 and D3. A portion of the insulating part 21 is located between the gate electrode 10 and the conductive part 22. Thereby, the gate electrode 10 and the conductive part 22 are electrically isolated from each other.

The gate electrode 10 faces the p-type base region 2 via a gate insulating layer 11 in the second and third directions D2 and D3. The gate electrode 10 also may face the n$^-$-type drift region 1 and the n$^+$-type source region 3 via the gate insulating layer 11. In the semiconductor device 100, a portion of the insulating part 21 functions as the gate insulating layer 11.

The high resistance part 30 is located in the n$^-$-type drift region 1. In the example, the high resistance part 30 is located in the n$^-$-type drift region 1, in the p-type base region 2, and in the n$^+$-type source region 3. The high resistance part 30 does not overlap the structure body 20 in the first direction D1. The electrical resistance of the high resistance part 30 is greater than the electrical resistance of the n$^-$-type drift region 1.

The n$^-$-type drift region 1 is electrically connected with a drain electrode 41 via the n$^+$-type drain region 5. For example, the drain electrode 41 is located under the n$^+$-type drain region 5.

The p-type base region 2 and the n$^+$-type source region 3 are electrically connected with a source electrode 42. The conductive part 22 is electrically connected with the source electrode 42. For example, the source electrode 42 is located on the p-type base region 2, the n$^+$-type source region 3, the gate electrode 10, and the structure body 20.

The gate electrode 10 is electrically connected with a gate pad 43. The gate pad 43 is electrically isolated from the source electrode 42.

In the semiconductor device 100 as illustrated in FIG. 1, the conductive part 22 has a regular hexagonal prism shape. The gate electrode 10 surrounds the conductive part 22 when viewed along the first direction D1. The gate electrode 10 has a regular hexagonal tube shape. The outer surface of the structure body 20 has a regular hexagonal prism shape. The structure body 20 is hexagonal when viewed along the first direction D1. The cross-sectional shape of the structure body 20 in a plane along the second and third directions D2 and D3 is hexagonal.

As illustrated in FIG. 1, multiple gate electrodes 10 and multiple structure bodies 20 are arranged along the second and third directions D2 and D3. For example, the p-type base region 2 and the n$^+$-type source region 3 are located around the structure body 20. The p-type base region 2 and the n$^+$-type source region 3 are located between the multiple structure bodies 20 and surround the structure bodies 20.

The multiple structure bodies 20 that are arranged along the second and third directions D2 and D3 include a first structure body 20a, a second structure body 20b, and a third structure body 20c. The first structure body 20a is one of the multiple structure bodies 20. The second structure body 20b is next to the first structure body 20a in the second direction D2. The third structure body 20c is next to the first structure body 20a in the third direction D3. In the example, the angle between the second direction D2 and the third direction D3 is 60 degrees.

In FIG. 1, a first center C1 illustrates the center of the first structure body 20a in the second and third directions D2 and D3. A second center C2 illustrates the center of the second structure body 20b in the second and third directions D2 and D3. A third center C3 illustrates the center of the third structure body 20c in the second and third directions D2 and D3. Here, an imaginary circle IC1 that passes through the first center C1, the second center C2, and the third center C3 is considered. In the semiconductor device 100, the first center C1, the second center C2, and the third center C3 exist on the circumference of one imaginary circle IC1. The distance between the first center C1 and a circle center C0 of the imaginary circle IC1 is equal to the distance between the circle center C0 and the second center C2 and the distance between the circle center C0 and the third center C3.

The angle between a first line direction LD1 connecting the circle center C0 and the first center C1 and a second line direction LD2 connecting the circle center C0 and the second center C2 is 120 degrees. The angle between the first line direction LD1 and a third line direction LD3 connecting the circle center C0 and the third center C3 is 120 degrees. The angle between the second line direction LD2 and the third line direction LD3 is 120 degrees. That is, in example, the triangle that is formed by connecting the first center C1, the second center C2, and the third center C3 is an equilateral triangle. In other words, in example, the first structure body 20a, the second structure body 20b, and the third structure body 20c are arranged in an equilateral triangular configuration when viewed along the first direction D1.

The distance between the first center C1 and the second center C2 is equal to the distance between the first center C1 and the third center C3 and the distance between the second center C2 and the third center C3. That is, the first structure body 20a, the second structure body 20b, and the third structure body 20c are arranged at a constant spacing in the second and third directions D2 and D3. For example, a distance L1 between the first structure body 20a and the second structure body 20b is L1=P1−W1, wherein P1 is the distance between the first center C1 and the second center C2, and W1 is the width in the second direction D2 of the first structure body 20a (the second structure body 20b).

The high resistance part 30 is located at a position that overlaps the circle center C0 in the first direction D1. In the example, the cross-sectional shape of the high resistance part 30 in a plane along the second and third directions D2 and D3 is an equilateral triangle that has the circle center C0 as the center. The equilateral triangle faces away from the equilateral triangle formed by connecting the first center C1, the second center C2, and the third center C3. The length of one side of the equilateral triangle is, for example, not more than the distance L1.

The high resistance part 30 may be located between all of the structure bodies 20 that are next to each other, or may be located only between a portion of the structure bodies 20 that are next to each other. That is, for example, the high resistance part 30 may not be located between the second structure body 20b, the first structure body 20a, and another structure body that is next to the first and second structure bodies 20a and 20b.

Operations of the semiconductor device 100 will now be described.

A voltage that is not less than a threshold is applied to the gate electrode 10 in a state in which a positive voltage with respect to the source electrode 42 is applied to the drain electrode 41. Thereby, a channel (an inversion layer) is formed in the p-type base region 2; and the semiconductor device 100 is set to the on-state. Electrons pass through the channel and flow from the source electrode 42 toward the drain electrode 41. Subsequently, when the voltage that is applied to the gate electrode 10 drops below the threshold, the channel in the p-type base region 2 disappears, and the semiconductor device 100 is set to the off-state.

When the semiconductor device 100 switches to the off-state, the positive voltage with respect to the source electrode 42 that is applied to the drain electrode 41 increases. In other words, the potential difference between the $n^-$-type drift region 1 and the conductive part 22 increases. Due to the increase of the potential difference, a depletion layer spreads toward the $n^-$-type drift region 1 from the interface between the insulating part 21 and the $n^-$-type drift region 1. In other words, the conductive part 22 functions as a FP (field plate) electrode. The depletion layer reaches the high resistance part 30. The breakdown voltage of the semiconductor device 100 can be increased by the spreading of the depletion layer. Or, the on-resistance of the semiconductor device 100 can be reduced by increasing the concentration of the impurity that forms donors in the $n^-$-type drift region 1 while maintaining the breakdown voltage of the semiconductor device 100.

Examples of the materials of the components of the semiconductor device 100 will now be described.

The $n^-$-type drift region 1, the p-type base region 2, the $n^+$-type source region 3, and the $n^+$-type drain region 5 include silicon, silicon carbide, gallium nitride, or gallium arsenide as a semiconductor material. When silicon is used as the semiconductor material, arsenic, phosphorus, or antimony can be used as the impurity that forms donors. Boron can be used as the impurity that forms acceptors.

The gate electrode 10 and the conductive part 22 include a conductive material such as polysilicon, etc. An impurity may be added to the conductive material. The insulating part 21 includes an insulating material. For example, the insulating part 21 includes silicon oxide or silicon nitride. The drain electrode 41 and the source electrode 42 include a metal such as aluminum, copper, etc.

The high resistance part 30 includes, for example, an insulating material. More specifically, the high resistance part 30 includes, for example, at least one of silicon oxide or silicon nitride. Or, the high resistance part 30 includes, for example, a semiconductor material. More specifically, the high resistance part 30 includes, for example, at least one of silicon or silicon germanium. When the high resistance part 30 includes a semiconductor material, the concentration of the impurity included in the high resistance part 30 is less than the concentration of the impurity included in the $n^-$-type drift region 1. For example, it is favorable for the high resistance part 30 to have tensile stress along the first direction D1.

Effects of the semiconductor device 100 according to the first embodiment will now be described.

For example, the symmetry of the extension of the depletion layer ensured by a structure in which the structure bodies extend in stripes along the third direction D3 degrades when a structure is used in which the multiple structure bodies 20 are arranged as dots along the second and third directions D2 and D3; and a region that is not easily depleted occurs between the structure bodies 20 that are next to each other. It is problematic to further increase the voltage to deplete this region because the electric field intensity increases and the breakdown voltage decreases.

According to the semiconductor device 100 according to the first embodiment, the reduction of the breakdown voltage that is caused by the region that is not depleted can be suppressed by providing the high resistance part 30 in the region that is not easily depleted. Also, by providing the high resistance part 30 that has tensile stress along the first direction D1, tensile strain along the first direction D1 can be generated in the $n^-$-type drift region 1 next to the high resistance part 30. Thereby, the mobility of the carriers is improved by the tensile strain along the first direction D1 in which the carriers flow; and the on-resistance can be reduced.

When the first structure body 20a, the second structure body 20b, and the third structure body 20c are arranged in an equilateral triangular configuration when viewed along the first direction D1, the reduction of the breakdown voltage can be more effectively suppressed by setting the cross-sectional shape of the high resistance part 30 in a plane along the second and third directions D2 and D3 to be an equilateral triangle having the circle center C0 as the center.

Also, the reduction of the breakdown voltage can be more effectively suppressed by the high resistance part 30 including an insulating material (e.g., at least one of silicon oxide or silicon nitride).

Also, the reduction of the breakdown voltage can be more effectively suppressed by the high resistance part 30 including a semiconductor material (e.g., at least one of silicon or silicon germanium) that has a low impurity concentration.

Second Embodiment

Figure 3:
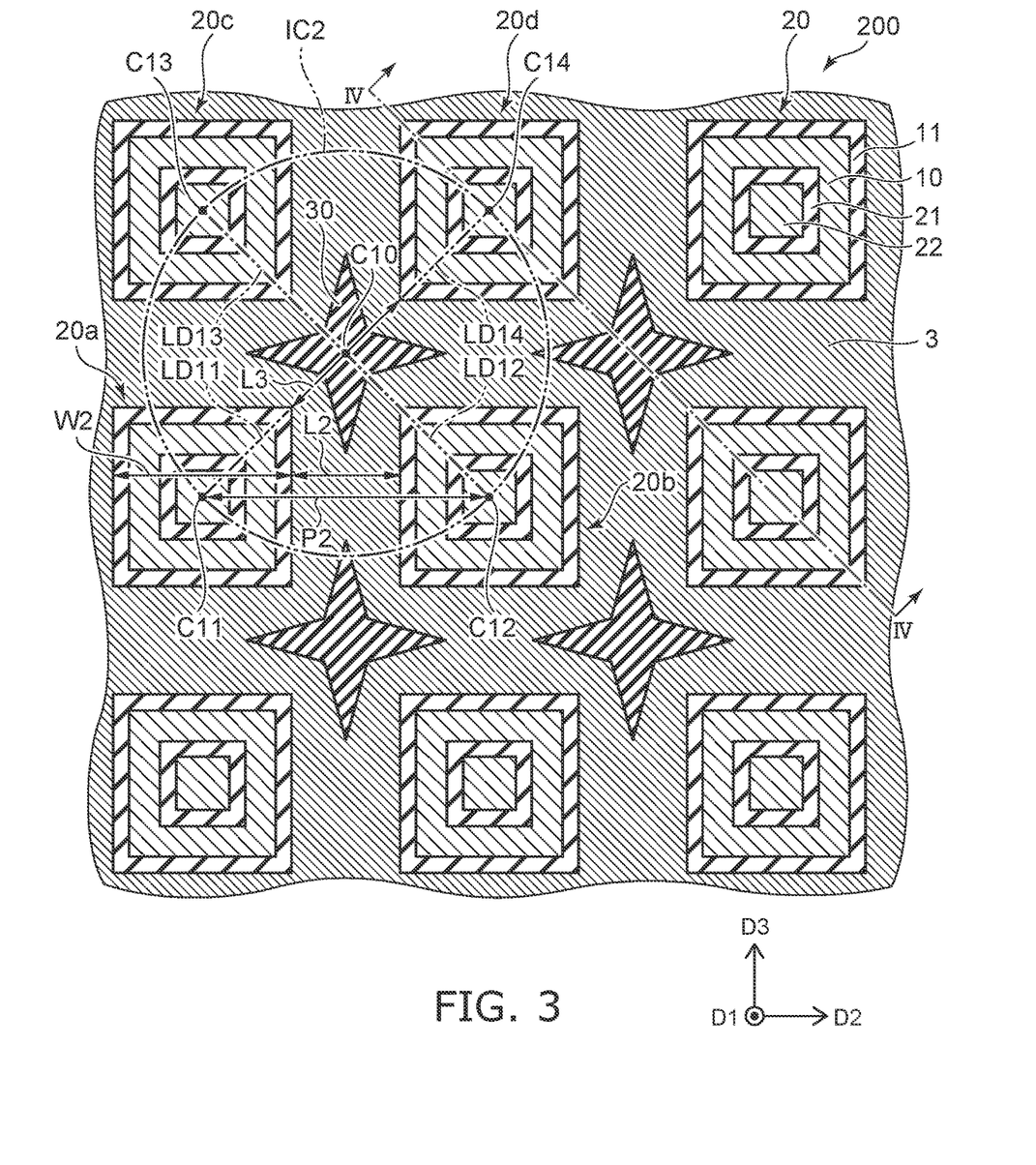
FIG. 3 is a plan view illustrating a portion of a semiconductor device according to a second embodiment.

FIG. 3 is a plan view illustrating a portion of a semiconductor device according to a second embodiment.

Figure 4:
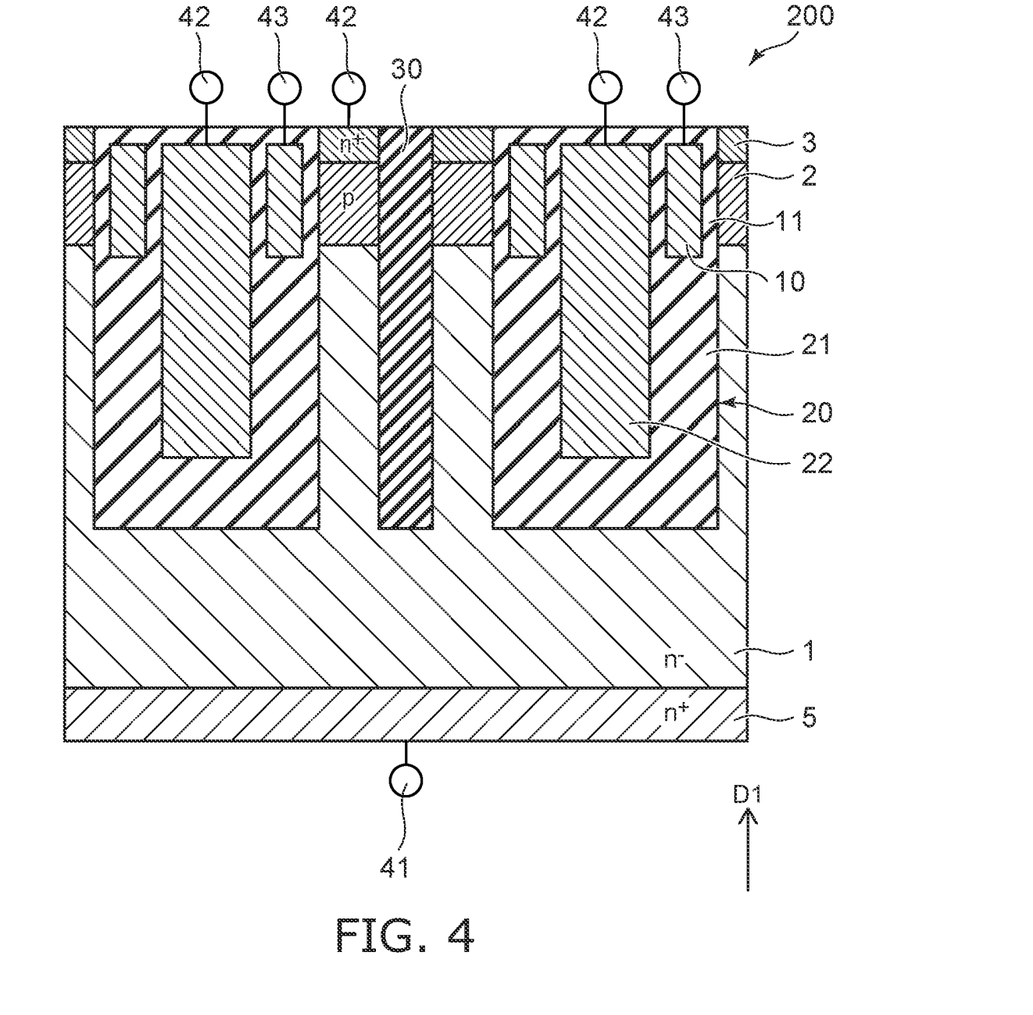
FIG. 4 is a IV-IV cross-sectional view of FIG. 3.

FIG. 4 is a IV-IV cross-sectional view of FIG. 3.

The semiconductor device 200 according to the second embodiment is, for example, a vertical MOSFET. The semiconductor device 200 is a MOSFET that has a so-called dot structure.

As illustrated in FIGS. 3 and 4, the semiconductor device 200 includes the $n^-$-type drift region 1, the p-type base region 2, the $n^+$-type source region 3, the $n^+$-type drain region 5, the gate electrode 10, the structure body 20, and the high resistance part 30.

In the semiconductor device 200 as illustrated in FIG. 3, the conductive part 22 has a square prism shape. Also, the gate electrode 10 surrounds the conductive part 22 when viewed along the first direction D1. The gate electrode 10 has a square tube shape. The outer surface of the structure body 20 has a square prism shape. The structure body 20 is quadrilateral when viewed along the first direction D1. The cross-sectional shape of the structure body 20 in a plane along the second and third directions D2 and D3 is quadrilateral.

The multiple structure bodies 20 that are arranged along the second and third directions D2 and D3 include the first structure body 20a, the second structure body 20b, the third structure body 20c, and a fourth structure body 20d. The first structure body 20a is one of the multiple structure bodies 20. The second structure body 20b is next to the first structure body 20a in the second direction D2. The third structure body 20c is next to the first structure body 20a in the third direction D3. The fourth structure body 20d is next to the third structure body 20c in the second direction D2 and next to the second structure body 20b in the third direction D3. In the example, the angle between the second direction D2 and the third direction D3 is 90 degrees.

In FIG. 3, a first center C11 is the center of the first structure body 20a in the second and third directions D2 and D3. A second center C12 is the center of the second structure body 20b in the second and third directions D2 and D3. A third center C13 is the center of the third structure body 20c in the second and third directions D2 and D3. A fourth center C14 is the center of the fourth structure body 20d in the second and third directions D2 and D3. Here, an imaginary circle IC2 that passes through the first center C11, the second center C12, the third center C13, and the fourth center C14 is considered. In the semiconductor device 200, the first center C11, the second center C12, the third center C13, and the fourth center C14 exist on the circumference of one imaginary circle IC2. The distance between the first center C11 and a circle center C10 of the imaginary circle IC2 is equal to the distance between the circle center C10 and the second center C12, the distance between the circle center C10 and the third center C13, and the distance between the circle center C10 and the fourth center C14.

The angle between a first line direction LD11 connecting the circle center C10 and the first center C11 and a second line direction LD12 connecting the circle center C10 and the second center C12 is 90 degrees. The angle between the first line direction LD11 and a third line direction LD13 connecting the circle center C10 and the third center C13 is 90 degrees. The angle between the second line direction LD12 and a fourth line direction LD14 connecting the circle center C10 and the fourth center C14 is 90 degrees. The angle between the third line direction LD13 and the fourth line direction LD14 is 90 degrees. That is, in the example, the quadrilateral that is formed by connecting the first center C11, the second center C12, the third center C13, and the fourth center C14 is a square. In other words, in the example, the first structure body 20a, the second structure body 20b, the third structure body 20c, and the fourth structure body 20d are arranged in a square configuration when viewed along the first direction D1.

The distance between the first center C11 and the second center C12 is equal to the distance between the first center C11 and the third center C13, the distance between the second center C12 and the fourth center C14, and the distance between the third center C13 and the fourth center C14. That is, the first structure body 20a, the second structure body 20b, the third structure body 20c, and the fourth structure body 20d are arranged at a constant spacing in the second and third directions D2 and D3. For example, a distance L2 between the first structure body 20a and the second structure body 20b is L2=P2−W2, wherein P2 is the distance between the first center C11 and the second center C12, and W2 is the width of the first structure body 20a (the second structure body 20b) in the second direction D2. Also, a distance L3 between the first structure body 20a and the fourth structure body 20d is L3=($\sqrt{2}$)×(P2−W2).

The high resistance part 30 is located at a position that overlaps the circle center C10 in the first direction D1. In the example, the cross-sectional shape of the high resistance part 30 in a plane along the second and third directions D2 and D3 is a cross shape that extends in the second and third directions D2 and D3 and has the circle center C10 as the center. The length in the second direction D2 of the cross shape is, for example, not less than the distance L2. The length in the third direction D3 of the cross shape is, for example, not less than the distance L2. That is, the high resistance part 30 is positioned between the first structure body 20a and the third structure body 20c in the third direction D3. Also, the high resistance part 30 is positioned between the second structure body 20b and the fourth structure body 20d in the third direction D3. The high resistance part 30 also is positioned between the first structure body 20a and the second structure body 20b in the second direction D2. The high resistance part 30 also is positioned between the third structure body 20c and the fourth structure body 20d in the second direction D2. The length of the cross shape in a direction connecting the first structure body 20a and the fourth structure body 20d is, for example, not more than the distance L3.

In the semiconductor device 200 as well, the high resistance part 30 may be located between all of the structure bodies 20 that are next to each other, or may be located only between a portion of the structure bodies 20 that are next to each other.

In the semiconductor device 200 according to the second embodiment as well, the reduction of the breakdown voltage caused by a region that is not depleted can be suppressed by providing the high resistance part 30 in the region that is not easily depleted. Also, tensile strain along the first direction D1 can be generated in the n⁻-type drift region 1 that is next to the high resistance part 30 by providing the high resistance part 30 that has tensile stress along the first direction D1. Thereby, the mobility of the carriers is improved by the tensile strain along the first direction D1 in which the carriers flow; and the on-resistance can be reduced.

When the first structure body 20a, the second structure body 20b, the third structure body 20c, and the fourth structure body 20d are arranged in a square configuration when viewed along the first direction D1, the reduction of the breakdown voltage can be more effectively suppressed by setting the cross-sectional shape of the high resistance part 30 in a plane along the second and third directions D2 and D3 to be a cross shape that extends in the second and third directions D2 and D3 and has the circle center C10 as the center.

According to embodiments as described above, the semiconductor device is provided in which the breakdown voltage can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions. Embodiments described above can be implemented in combination with each other.

What is claimed is:

1. A semiconductor device, comprising:
  a first semiconductor region of a first conductivity type;
  a second semiconductor region located on the first semiconductor region, the second semiconductor region being of a second conductivity type;
  a third semiconductor region located selectively on the second semiconductor region, the third semiconductor region being of the first conductivity type;
  a structure body including
    an insulating part arranged with the third semiconductor region, the second semiconductor region, and a portion of the first semiconductor region in a second direction and a third direction, the second direction being perpendicular to a first direction, the first direction being from the first semiconductor region toward the second semiconductor region, the third direction crossing the second direction and being perpendicular to the first direction, and a conductive part located in the insulating part, the conductive part including a portion facing the first semiconductor region in the second and third directions;

a gate electrode facing the second semiconductor region in the second and third directions; and a high resistance part located in the first semiconductor region, the high resistance part having a higher electrical resistance than the first semiconductor region, a plurality of the structure bodies being arranged along the second and third directions, the plurality of the structure bodies including
- a first structure body,
- a second structure body next to the first structure body in the second direction, and
- a third structure body next to the first structure body in the third direction, the high resistance part overlapping a circle center of an imaginary circle in the first direction, the imaginary circle passing through centers in the second and third directions of the first, second, and third structure bodies.

2. The device according to claim 1, wherein
the first structure body, the second structure body, and the third structure body are arranged in an equilateral triangular configuration when viewed along the first direction, and a cross-sectional shape of the high resistance part in a plane along the second and third directions is an equilateral triangle having the circle center as a center.

3. The device according to claim 2, wherein
the structure body is hexagonal when viewed along the first direction.

4. The device according to claim 1, wherein
the plurality of the structure bodies further includes a fourth structure body that is next to the third structure body in the second direction and next to the second structure body in the third direction, the first structure body, the second structure body, the third structure body, and the fourth structure body are arranged in a square configuration when viewed along the first direction, and a cross-sectional shape of the high resistance part in a plane along the second and third directions is a cross shape extending in the second and third directions and having the circle center as a center.

5. The device according to claim 4, wherein
the structure body is quadrilateral when viewed along the first direction.

6. The device according to claim 1, wherein
the high resistance part includes an insulating material.

7. The device according to claim 6, wherein
the high resistance part includes at least one of silicon oxide or silicon nitride.

8. The device according to claim 1, wherein
the high resistance part includes a semiconductor material, and a concentration of an impurity included in the high resistance part is less than a concentration of an impurity included in the first semiconductor region.

9. The device according to claim 8, wherein
the high resistance part includes at least one of silicon or silicon germanium.

* * * * *